United States Patent
Ohira et al.

(10) Patent No.: US 9,236,302 B2
(45) Date of Patent: Jan. 12, 2016

(54) SEMICONDUCTOR DEVICE AND MANUFACTURING METHOD OF SEMICONDUCTOR DEVICE

(71) Applicant: FUJITSU SEMICONDUCTOR LIMITED, Yokohama-shi, Kanagawa (JP)

(72) Inventors: Hikaru Ohira, Akishima (JP); Tamotsu Owada, Yokohama (JP); Hirosato Ochimizu, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/703,478

(22) Filed: May 4, 2015

(65) Prior Publication Data
US 2015/0235901 A1   Aug. 20, 2015

Related U.S. Application Data

(62) Division of application No. 14/206,545, filed on Mar. 12, 2014.

(30) Foreign Application Priority Data

Apr. 16, 2013   (JP) .................. 2013-085851

(51) Int. Cl.
| H01L 21/768 | (2006.01) |
| H01L 21/3105 | (2006.01) |
| H01L 21/321 | (2006.01) |
| H01L 21/311 | (2006.01) |

(52) U.S. Cl.
CPC .... *H01L 21/76898* (2013.01); *H01L 21/31055* (2013.01); *H01L 21/31111* (2013.01); *H01L 21/3212* (2013.01); *H01L 21/7684* (2013.01); *H01L 21/76877* (2013.01)

(58) Field of Classification Search
CPC . H01L 21/76877; H01L 23/481; H01L 25/04; H01L 21/76898
USPC .................. 257/737, 774; 438/667
See application file for complete search history.

(56) References Cited

U.S. PATENT DOCUMENTS

| 2005/0051883 | A1 | 3/2005 | Fukazawa | |
| 2005/0287783 | A1* | 12/2005 | Kirby et al. | 438/597 |
| 2007/0045836 | A1* | 3/2007 | Kwon et al. | 257/734 |
| 2010/0178761 | A1* | 7/2010 | Chen et al. | 438/613 |
| 2010/0182041 | A1* | 7/2010 | Feng et al. | 326/38 |
| 2010/0210184 | A1* | 8/2010 | Narita | 451/36 |
| 2012/0228780 | A1* | 9/2012 | Kim et al. | 257/774 |
| 2014/0175614 | A1* | 6/2014 | Wang et al. | 257/621 |

FOREIGN PATENT DOCUMENTS

JP   2005-12024 A   1/2005

* cited by examiner

*Primary Examiner* — Christine Enad
(74) *Attorney, Agent, or Firm* — Westerman, Hattori, Daniels & Adrian, LLP (57) ABSTRACT

A semiconductor device has a semiconductor substrate having a first surface and a second surface, a through electrode penetrating through the semiconductor substrate and having a protrusion protruding from the second surface, and an insulation layer on the second surface, which covers the side surface of the protrusion, has an opening through which to expose the end surface of the protrusion, and has a thickness greater than the length of the protrusion.

11 Claims, 11 Drawing Sheets

SEMICONDUCTOR DEVICE AND MANUFACTURING METHOD OF SEMICONDUCTOR DEVICE

CROSS-REFERENCE TO RELATED APPLICATIONS

This application is a Divisional of copending U.S. application Ser. No. 14/206,545 filed Mar. 12, 2014, which is based upon and claims the benefit of priority of the prior Japanese Patent Application No. 2013-85851, filed on Apr. 16, 2013, the entire contents of which are incorporated herein by reference.

FIELD

The present invention relates to a semiconductor device and a manufacturing method of a semiconductor device.

BACKGROUND

Conventionally, a semiconductor device in which a plurality of semiconductor substrates having an element layer is laminated is used.

In order to increase speed, reduce power consumption, etc., of an electronic device, a three-dimensional packaging technique for laminating a plurality of semiconductor substrates having an element layer for accommodating the semiconductor substrates in one package has been proposed.

In the three-dimensional packaging technique, an electrode that penetrates through a semiconductor substrate is used in order to electrically connect semiconductor substrates to be laminated.

Figure 1:
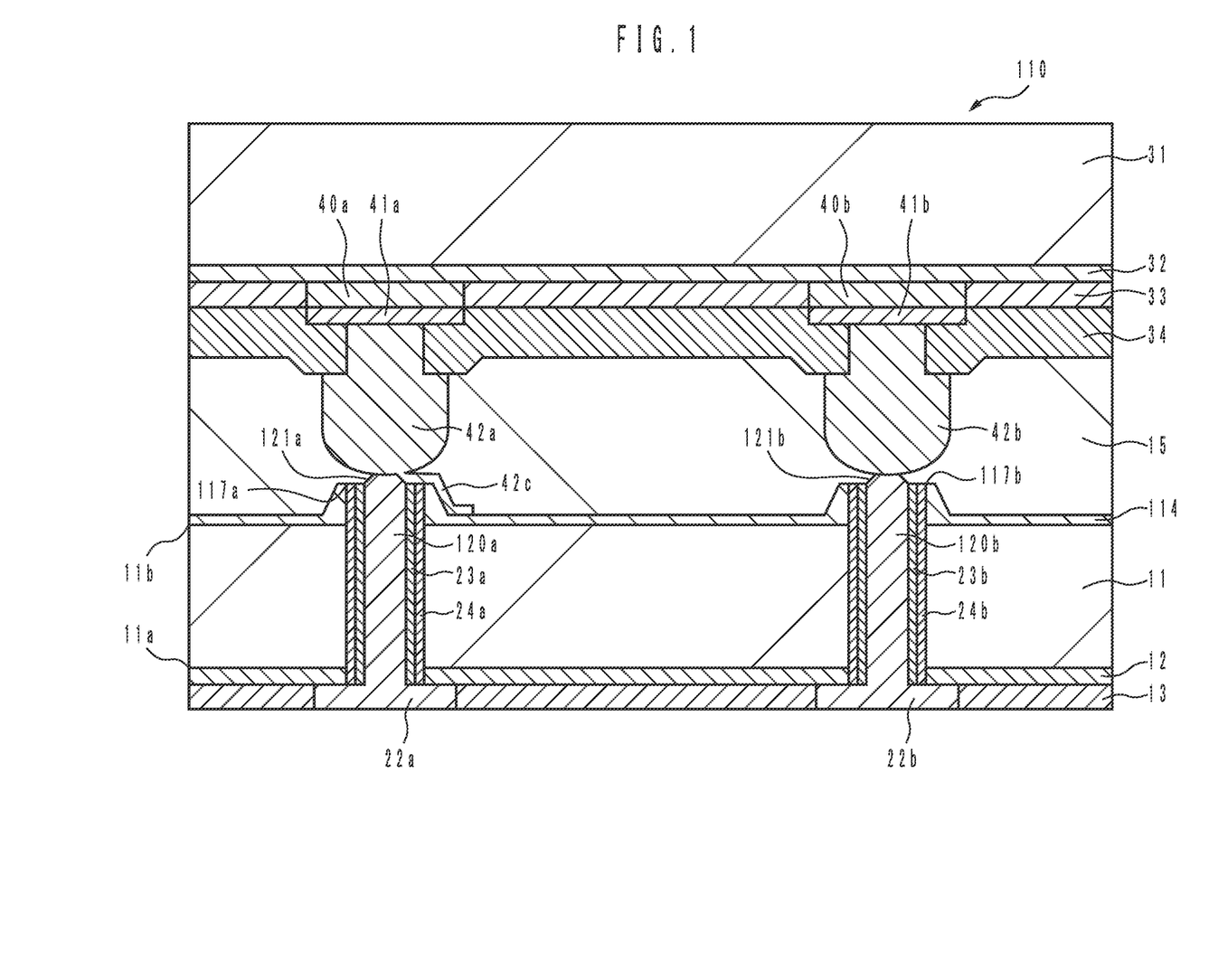
FIG. 1 is a diagram depicting a conventional semiconductor device.

FIG. 1 is a diagram depicting a conventional semiconductor device.

A semiconductor device 101 is formed by laminating a first semiconductor substrate 11 having a first element layer 12 and a second semiconductor substrate 31 having a second element layer 32. The first element layer 12 and the second element layer 32 are electrically connected via through electrodes 120a and 120b penetrating through the first semiconductor substrate 11, bumps 42a and 42b, etc.

The first semiconductor substrate 11 has a first surface 11a on which the first element layer 12 is formed and a second surface 11b on the opposite side of the first surface 11a. The through electrodes 120a and 120b penetrate through the first semiconductor substrate 11 from the first surface 11a toward the second surface 11b and part thereof protrudes from the second surface 11b. The side surfaces of the through electrodes 120a and 120b are coated with barrier layers 23a and 23b and electrode insulation layers 24a and 24b.

On the second surface 11b of the first semiconductor substrate 11, a first insulation layer 114 is laminated so as to embed the side surfaces of the through electrodes 120a and 120b. The first insulation layer 114 has openings 117a and 117b through which the through electrodes 120a and 120b are exposed. End surfaces 121a and 121b on the side of the second surface 11b of the through electrodes 120a and 120b are exposed through the openings 117a and 117b.

The thickness of the first insulation layer 114 is less than the length of the portions of the through electrodes 120a and 120 protruding from the second surface 11b. The thickness of the portion of the first insulation layer 114 between the through electrode 120a and the through electrode 120b is less than that of the portions covering the side surfaces of the through electrodes 120a and 120b.

On the first element layer 12 of the first semiconductor substrate 11, a first wire layer 13 is laminated. To the end parts on the side of the first surface 11a in the lengthwise direction of the through electrodes 120a and 120b, contacts 22a and 22b arranged within the first wire layer 13 are connected. The through electrodes 120a and 120b are electrically connected with the first element layer 12 via the contacts 22a and 22b. On the contacts 22a and 22b, bumps, not depicted, are arranged.

On the second element layer 32 of the second semiconductor substrate 31, a second wire layer 33 is laminated. On the second wire layer 33, a second insulation layer 34 is laminated.

Within the second wire layer 33, contacts 40a and 40b electrically connected to the second element layer 32 are arranged. On the contacts 40a and 40b, pads 41a and 41b are arranged. On the pads 41a and 41b, the bumps 42a and 42b are arranged.

Part of the pads 41a and 41b and the bumps 42a and 42b is embedded within the second insulation layer 34.

The end surfaces 121a and 121b on the side of the second surface 11b of the through electrodes 120a and 120b are in contact with the bumps 42a and 42b.

Between the first insulation layer 114 and the second insulation layer 34, a filler layer 15 is filled in so as to embed the bumps 42a and 42b.

The first element layer 12 on the first semiconductor substrate 11 and the second element layer 32 on the second semiconductor substrate 31 are electrically connected via the contacts 22a and 22b, the through electrodes 120a and 120b, the bumps 42a and 42b, the pads 41a and 41b, and the contacts 40a and 40b.

Japanese Laid-open Patent Publication No. 2005-12024

As described above, the through electrode 120a protrudes from the second surface 11b and the length of the protruding portion is greater than the thickness of the first insulation layer 114. Consequently, when the bump 42a and the through electrode 120a are joined, there is a case where a part 42c of the molten bump 42a flows out to the lateral side of the through electrode 120a. If the electric conductor forming the bump 42a extends onto the first insulation layer 114, there is a possibility that a current leak path is formed.

As described above, with the conventional three-dimensional packaging technique of a semiconductor device, there is a possibility that a failure may occur in joining of the bump and the through electrode.

SUMMARY

According to an aspect of the embodiment, a semiconductor device disclosed in the present specification includes: a semiconductor substrate having a first surface and a second surface; a through electrode penetrating through the semiconductor substrate and having a protrusion protruding from the second surface; and an insulation layer on the second surface, which covers the side surface of the protrusion, has an opening through which to expose the end surface of the protrusion, and has a thickness greater than the length of the protrusion.

According to an aspect of the embodiment, a semiconductor device disclosed in the present specification includes: a first semiconductor substrate having a first surface and a second surface; a through electrode penetrating through the first semiconductor substrate and having a protrusion protruding from the second surface; an insulation layer on the second surface, which covers the side surface of the protrusion, has an opening through which to expose the end surface of the protrusion, and has a thickness greater than the length of the protrusion; and a second semiconductor substrate having a bump, and the second semiconductor substrate is laminated on the first semiconductor substrate so that the bump comes into contact with the end surface.

According to an aspect of the embodiment, a manufacturing method of a semiconductor device disclosed in the present specification includes: forming an electrically conductive part extending from a first surface of the semiconductor substrate toward the side of a third surface side up to part of the way; forming a protrusion by forming a second surface by processing the semiconductor substrate from the side of the third surface to reduce the thickness of the semiconductor substrate and by protruding part of the electrically conductive part from the second surface; covering the protrusion by forming an insulation layer having a thickness greater than the length of the protrusion on the second surface; and forming an opening in the insulation layer, through which to expose the end surface of the protrusion, by reducing the thickness of the insulation layer and also processing the insulation layer and the protrusion so that the length of the protrusion becomes less than the thickness of the insulation layer.

The object and advantages of the embodiments will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferred embodiments of a semiconductor device disclosed in the present specification are illustrated with reference to drawings. However, the technical scope of the present invention is not limited to the embodiments and the scope encompasses the inventions described in the claims and equivalents thereof.

Figure 2:
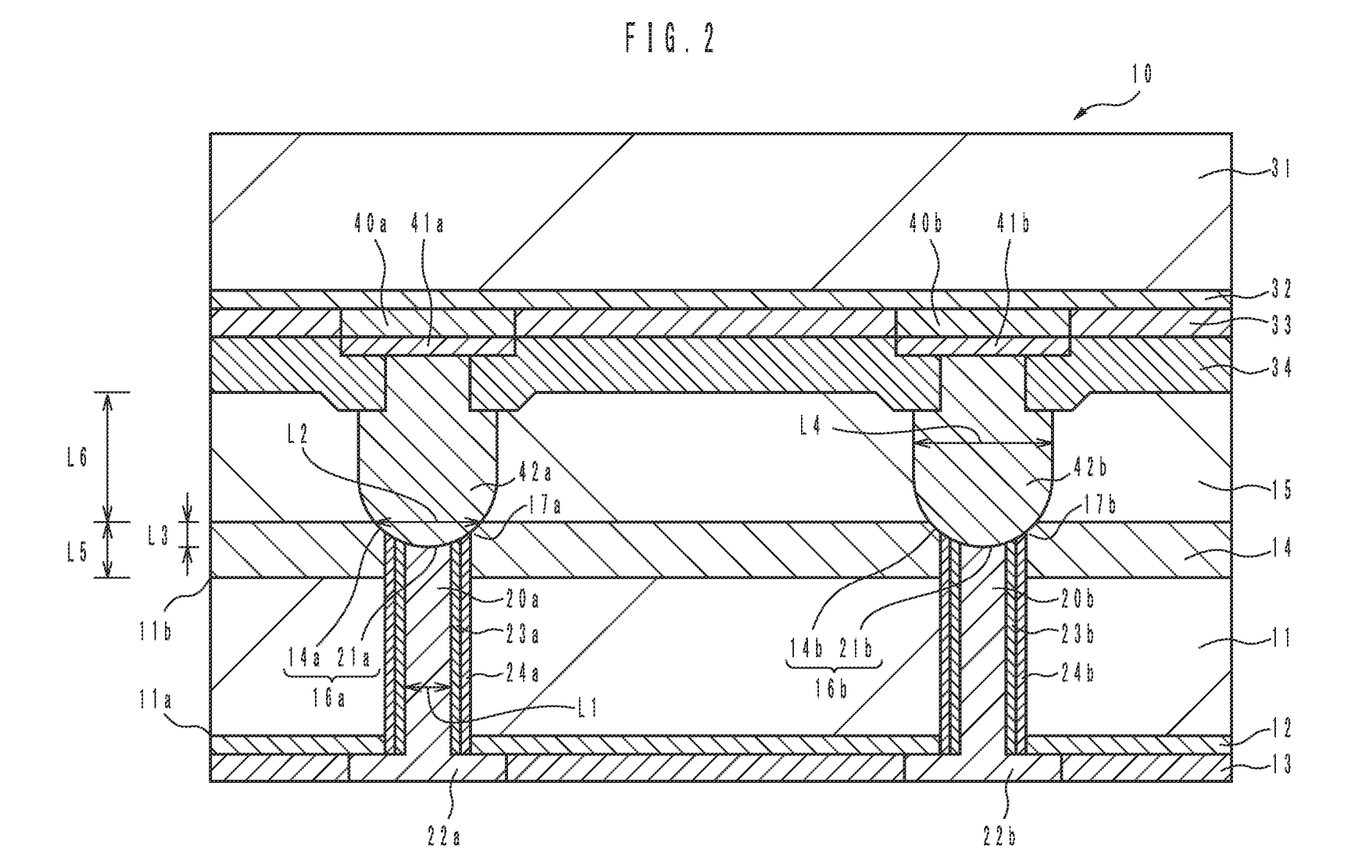
FIG. 2 is a diagram depicting an embodiment of a semiconductor device disclosed in the present specification.

FIG. 2 is a diagram depicting an embodiment of a semiconductor device disclosed in the present specification.

A semiconductor device 10 of the present embodiment is formed by laminating a first semiconductor substrate 11 having a first element layer 12 and a second semiconductor substrate 31 having a second element layer 32. The first element layer 12 and the second element layer 32 are electrically connected via through electrodes 20a and 20b penetrating through the first semiconductor substrate 11, bumps 42a and 42b, etc.

The first semiconductor substrate 11 has a first surface 11a on which the first element layer 12 is formed and a second surface 11b on the opposite side of the first surface 11a. The through electrodes 20a and 20b penetrate through the first semiconductor substrate 11 from the first surface 11a toward the second surface 11b and part thereof protrudes from the second surface 11b.

The through electrodes 20a and 20b are formed by filling through holes penetrating through the first semiconductor substrate 11 with an electric conductor.

The side surfaces of the through electrodes 20a and 20b are coated with barrier layers 23a and 23b and electrode insulation layers 24a and 24b. The barrier layers 23a and 23b prevent the electric conductor within the through hole from diffusing into the first semiconductor substrate 11. The electrode insulation layers 24a and 24b electrically insulate the electric conductor within the through hole from the first semiconductor substrate 11.

On the second surface 11b of the first semiconductor substrate 11, a first insulation layer 14 is laminated so as to embed the side surfaces of the through electrodes 20a and 20b. The thickness of the first insulation layer 14 is greater than the length of the portions of the through electrodes 20a and 20b protruding from the second surface 11b. Further, the first insulation layer 14 has openings 17a and 17b through which the through electrodes 20a and 20b are exposed. The first insulation layer 14 protects the through electrodes 20a and 20b as well as electrically insulating the side surfaces of the through electrodes 20a and 20b from the surroundings.

End surfaces 21a and 21b on the side of the second surface 11b in the lengthwise direction of the through electrodes 20a and 20b has a shape concave toward the side of the first surface 11a of the first semiconductor substrate 11. The positions of the end surfaces 21a and 21b are nearer to the first surface 11a than the surface of the first insulation layer 14 in the thickness direction of the first semiconductor substrate 11.

Figure 8:
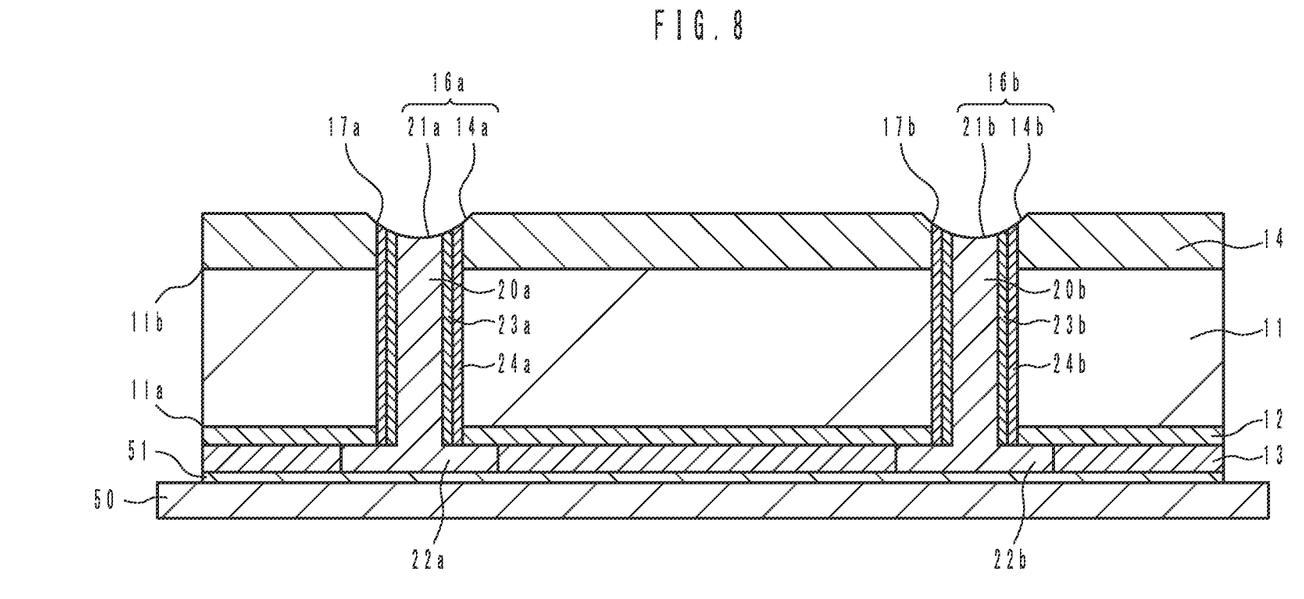
FIG. 8 is a diagram depicting the process (part 6) of the first embodiment of the manufacturing method of the semiconductor device disclosed in the present specification.

Around the openings 17a and 17b of the first insulation layer 14, slant parts 14a and 14b that slant from the surface of the first insulation layer 14 toward the end surfaces 21a and 21b of the through electrodes 20a and 20b are formed (see FIG. 2 and FIG. 8).

The end surfaces 21a and 21b and the slant parts 14a and 14b form concave parts 16a and 16b having a curved surface. The end surfaces of the barrier layers 23a and 23b and the electrode insulation layers 24a and 24b also form part of the concave parts 16a and 16b.

The bumps 42a and 42b have a shape that fits the curved surfaces of the concave parts 16a and 16b and electrically connect with the end surfaces 21a and 21b of the through electrodes 20a and 20b exposed through the openings 17a and 17b.

On the first element layer 12 of the first semiconductor substrate 11, a first wire layer 13 is laminated. To the end parts on the side of the first surface 11a in the lengthwise direction of the through electrodes 20a and 20b, contacts 22a and 22b arranged within the first wire layer 13 are connected. The through electrodes 20a and 20b electrically connect with the first element layer 12 via the contacts 22a and 22b. On the contacts 22a and 22b, bumps, not depicted, are arranged.

On the second element layer 32 of the second semiconductor substrate 31, a second wire layer 33 is laminated. On the second wire layer 33, a second insulation layer 34 is laminated.

Within the second wire layer 33, contacts 40a and 40b electrically connected with the second element layer 32 are arranged. On the contacts 40a and 40b, electrically conductive pads 41a and 41b are arranged. On the pads 41a and 41b, the bumps 42a and 42b are arranged. It may also be possible to arrange a seed layer that improves the electrical connection between the contacts 40a and 40b and the pads 41a and 41b in between. Similarly, It may also be possible to arrange a seed layer that improves the electrical connection between the pads 41a and 41b and the bumps 42a and 42b in between.

Part of the pads 41a and 41b and the bumps 42a and 42b is embedded within the second insulation layer 34.

Between the first insulation layer 14 and the second insulation layer 34, a filler layer 15 is filled in so as to embed the bumps 42a and 42b. The filler layer 15 protects the bumps 42a and 42b as well as electrically insulating the bumps 42a and 42b from the surroundings.

The first element layer 12 on the first semiconductor substrate 11 and the second element layer 32 on the second semiconductor substrate 31 are electrically connected via the contacts 22a and 22b, the through electrodes 20a and 20b, the bumps 42a and 42b, the pads 41a and 41b, and the contacts 40a and 40b.

The dimensions of each component of the semiconductor device 10 of the present embodiment may be set appropriately. For example, a diameter L1 of the through electrodes 20a and 20b may be set to 5 to 10 μm. Preferably, a diameter L2 of the concave parts 16a and 16b is 15 μm or less. Preferably, a depth L3 of the concave parts 16a and 16b is 5 μm or less. A diameter L4 of the bumps 42a and 42b may be set to 10 to 30 μm. Preferably, a thickness L5 of the first insulation layer 14 is 10 μm or less. A thickness L6 of the filler layer 15 may be set to 5 to 10 μm.

The forming material of each component of the semiconductor device 10 of the present embodiment may be selected appropriately. As the forming material of the first semiconductor substrate 11 and the second semiconductor substrate 31, for example, a silicon substrate may be used. As the forming material of the through electrodes 20a and 20b, for example, copper or aluminum may be used. As the forming material of the first insulation layer 14, for example, resin, such as polyimide resin and epoxy resin, or the Low-k material, such as SiOC, may be used. As the forming material of the second insulation layer 34, for example, silicon oxide or silicon nitride may be used. As the forming material of the barrier layers 23a and 23b, for example, Ta, TaN, and TiN may be used. As the forming material of the electrode insulation layers 24a and 24b, for example, TEOS may be used.

The semiconductor device 10 in the example depicted in FIG. 2 has two through electrodes penetrating through the first semiconductor substrate, however, the semiconductor device 10 may have one or three or more through electrodes.

Next, a first embodiment of a manufacturing method of the semiconductor device of the present embodiment described above is illustrated below with reference to the drawings.

Figure 3:
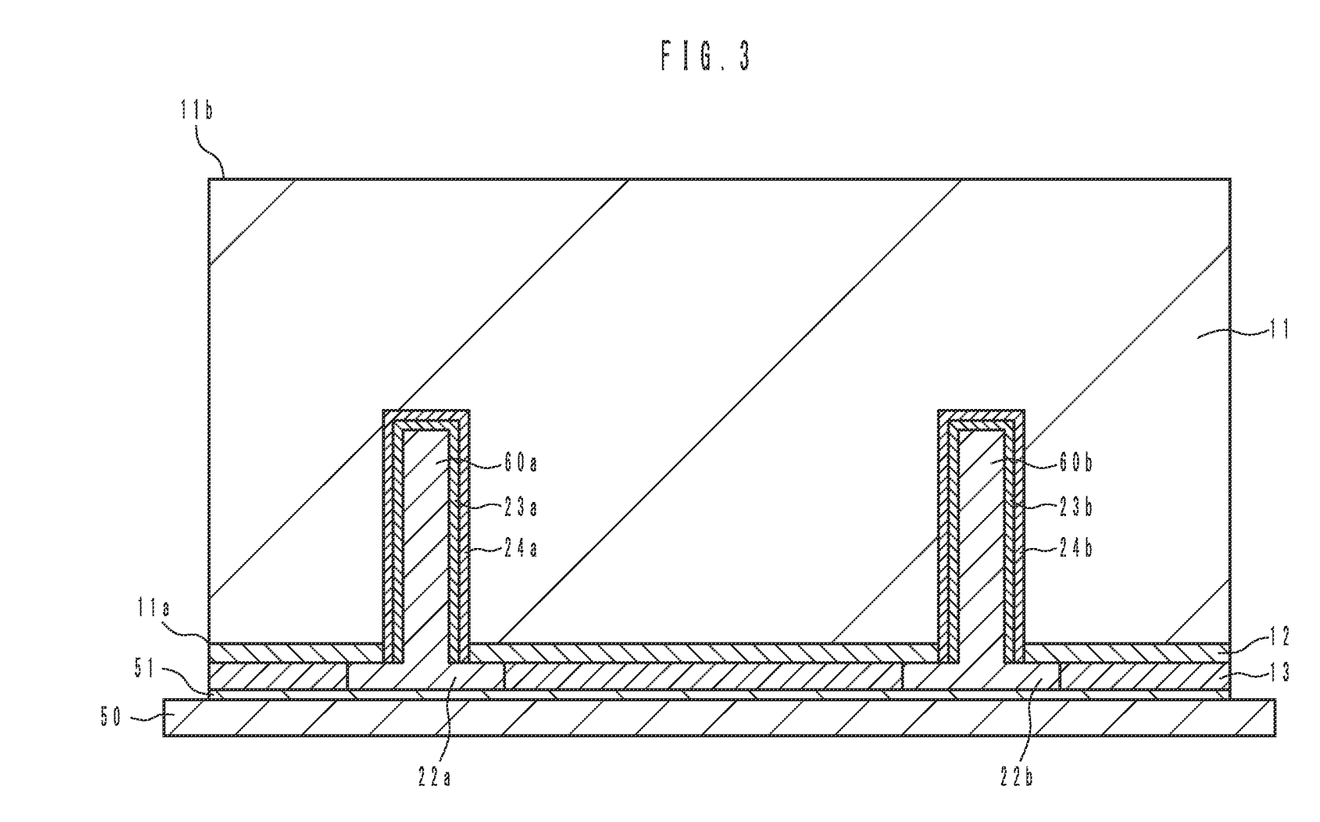
FIG. 3 is a diagram depicting a process (part 1) of a first embodiment of a manufacturing method of a semiconductor device disclosed in the present specification.

First, as depicted in FIG. 3, the first semiconductor substrate 11 having the first surface 11a on which the first element layer 12 is formed and the second surface 11b on the opposite side of the first surface 11a is prepared. Then, after holes extending from the first surface 11a of the first semiconductor substrate 11 toward the side of the second surface 11b up to part of the way are formed, the electrode insulation layers 24a and 24b and the barrier layers 23a and 23b are formed in order on the inner walls of the holes. Then, the insides of the holes are filled with an electric conductor and thus electrically conductive layers 60a and 60b are formed. In the present embodiment, copper is used as the electric conductor.

Then, the contacts 22a and 22b and the first wire layer 13 that electrically connect the electrically conductive layers 60a and 60b and the first element layer 12 are formed on the first element layer 12. Further, bumps, not depicted, are formed on the contacts 22a and 22b. Then, the contacts 22a and 22b on which the bumps, not depicted, are formed and the first wire layer 13 are bonded onto a support substrate 50 via an adhesive layer 51 in an attachable/detachable manner. As the support substrate 50, for example, a silicon substrate or a glass plate may be used.

Figure 4:
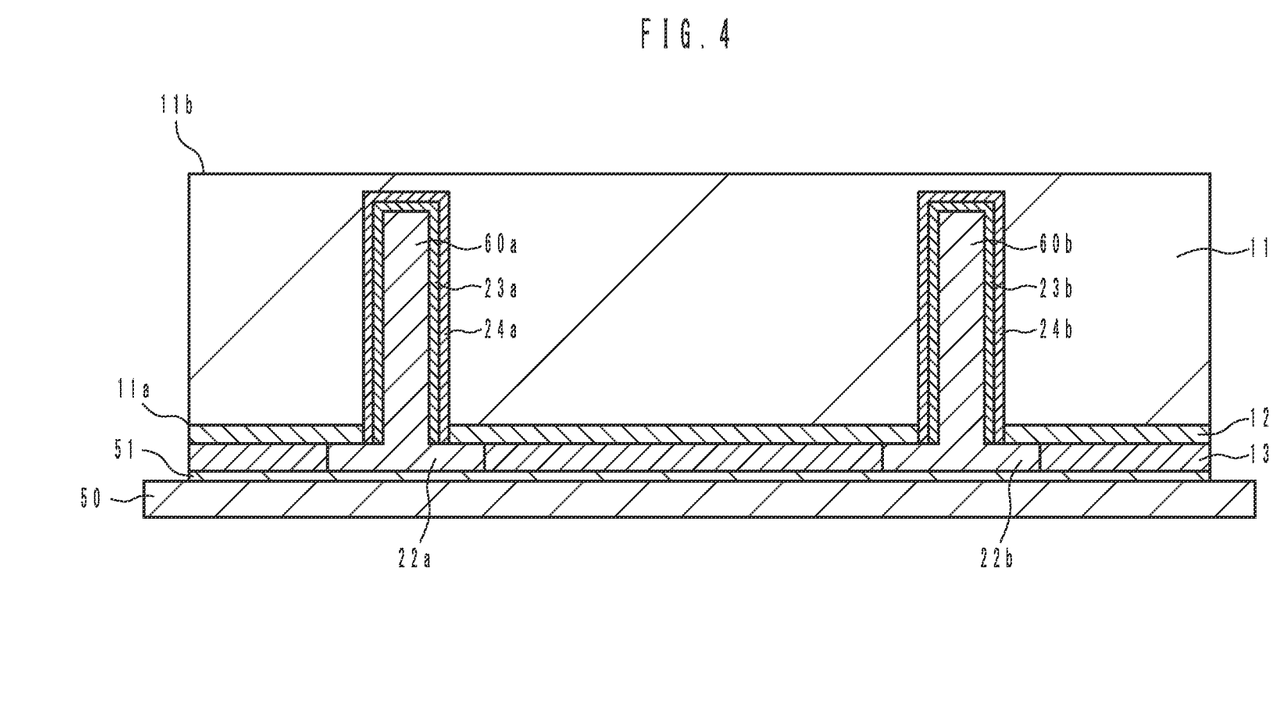
FIG. 4 is a diagram depicting the process (part 2) of the first embodiment of the manufacturing method of the semiconductor device disclosed in the present specification.

Next, as depicted in FIG. 4, the first semiconductor substrate 11 is processed from the side of the second surface 11b by reducing the thickness of the first semiconductor substrate 11 so that the second surface 11b comes closer to the first surface 11a. As the processing method of the first semiconductor substrate 11, for example, it is possible to use the grinding method, such as back grinding, the polishing method, such as chemical mechanical polishing (CMP), etc. The amount of reduction in thickness by processing the first semiconductor substrate 11 may be set appropriately from the viewpoint of the degree of flatness, etc., of the second surface 11b.

Figure 5:
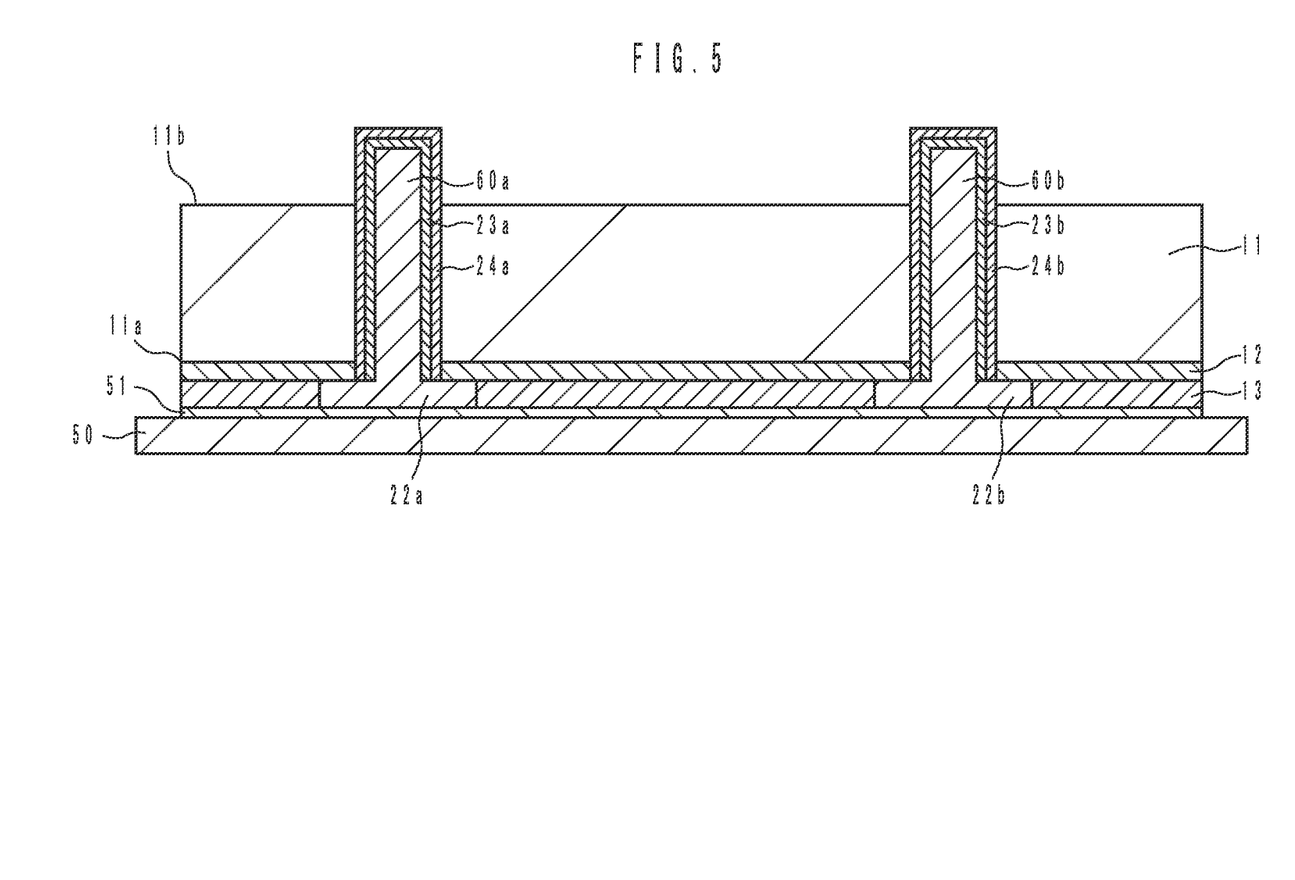
FIG. 5 is a diagram depicting the process (part 3) of the first embodiment of the manufacturing method of the semiconductor device disclosed in the present specification.

Next, as depicted in FIG. 5, the thickness of the first semiconductor substrate 11 is further reduced by etching the side of the second surface 11b of the first semiconductor substrate 11 so as to protrude part of the electrically conductive layers 60a and 60b from the second surface 11b. As the etching method, wet etching or dry etching may be used. Preferably, the etching method enables selection of etching having an etching rate for the first semiconductor substrate 11 higher than that for the electrode insulation layers 24a and 24b. The electrically conductive layers 60a and 60b are maintained in the state of being coated with the electrode insulation layers 24a and 24b and the barrier layers 23a and 23b.

Figure 6:
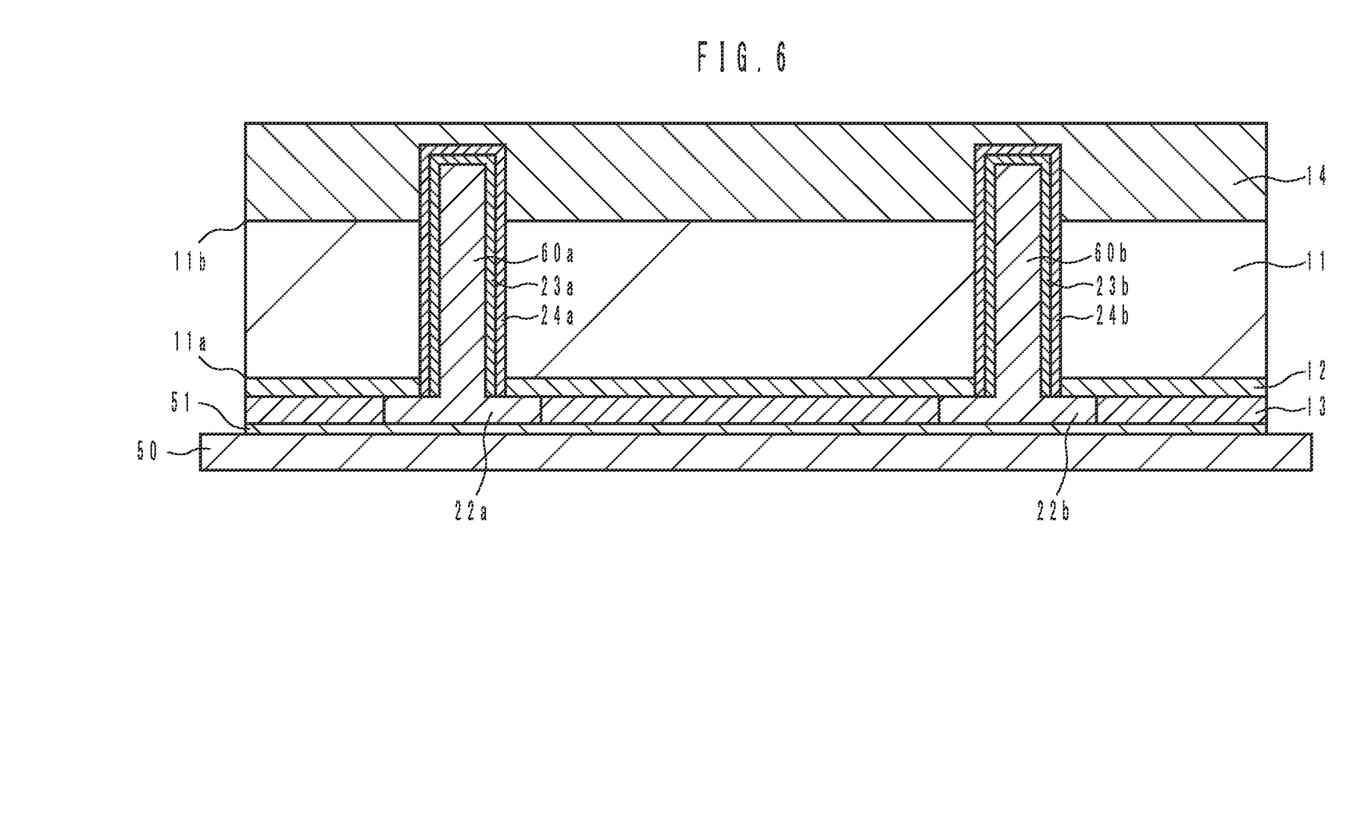
FIG. 6 is a diagram depicting the process (part 4) of the first embodiment of the manufacturing method of the semiconductor device disclosed in the present specification.

Next, as depicted in FIG. 6, the first insulation layer 14 whose thickness is greater than the length of the portions of the electrically conductive layers 60a and 60b protruding from the second surface 11b is formed on the second surface 11b. The first insulation layer 14 is formed so as to embed the side surfaces and the end surfaces of the electrically conductive layers 60a and 60b, on which the electrode insulation layers 24a and 24b and the barrier layers 23a and 23b are formed. The first insulation layer 14 is formed so that the thickness of the portion of the first insulation layer 14 between the electrically conductive layer 60a and the electrically conductive layer 60b is also greater than the length of the portions of the electrically conductive layers 60a and 60b protruding from the second surface 11b.

As the method for forming the first insulation layer 14, for example, it is possible to use the application method, such as spin coat, or the vapor deposition method, such as CVD. In the present embodiment, the first insulation layer 14 is formed by the Low-k material by using the spin coat method.

Figure 7:
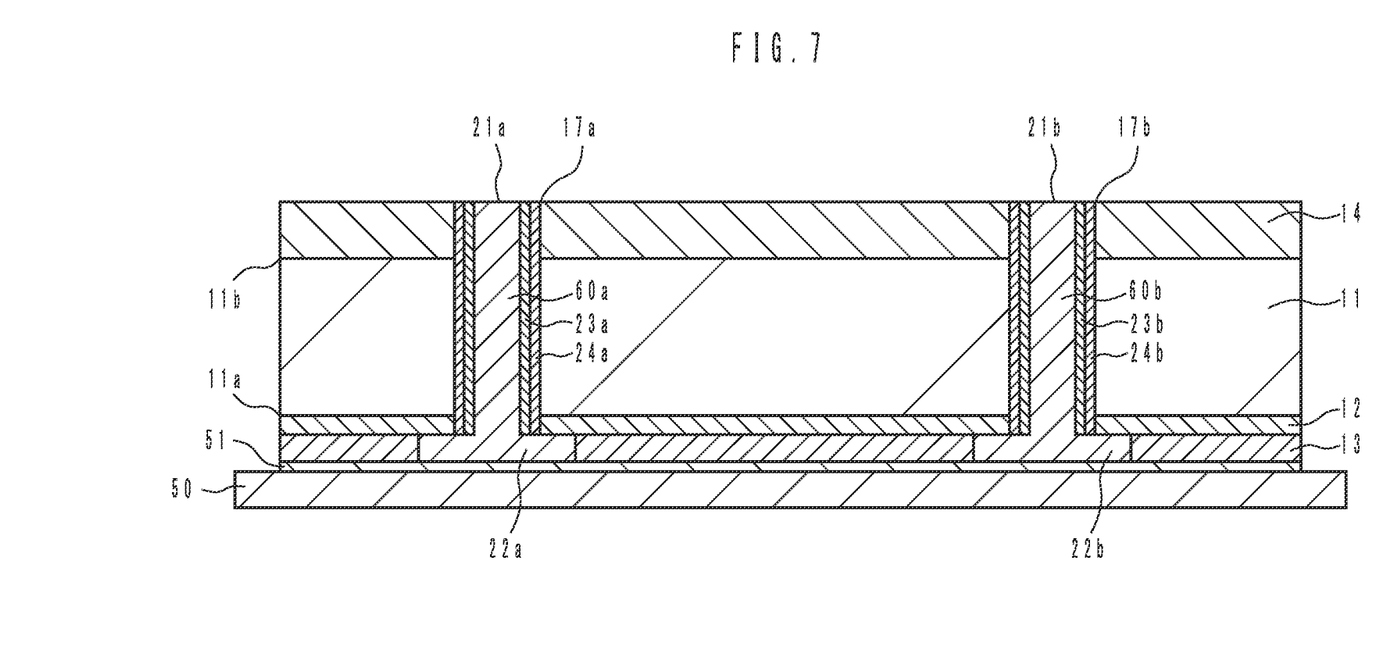
FIG. 7 is a diagram depicting the process (part 5) of the first embodiment of the manufacturing method of the semiconductor device disclosed in the present specification.

Next, as depicted in FIG. 7, the first insulation layer 14 is processed so that the thickness of the first insulation layer 14 is reduced until the electrically conductive layers 60a and 60b are exposed.

As the processing method of the first insulation layer 14, it is possible to use, for example, the grinding method, such as single point tool grinding, and the polishing method, such as chemical mechanical polishing (CMP). As the processing method, it is preferable to select a processing method in accordance with the forming material of the first insulation layer 14 from the viewpoint of reducing the tact time of the process. The processing rate is the grinding rate or the polishing rate of the first insulation layer 14.

In the present embodiment, as the processing method of the first insulation layer 14, CMP is selected, which has a processing rate equal to or higher than a predetermined rate for the Low-k material forming the first insulation layer 14. As the slurry used in CMP, it is preferable to use slurry having a polishing rate equal to or higher than a predetermined rate for the barrier layers 23a and 23b from the viewpoint of reducing the tact time of the process. Preferably, such slurry includes, as its component, abrasive grains, such as colloidal silica, or an organic acid, such as a chelating agent, a citric acid, and an oxalic acid, or an additive, such as ammonia water, potassium hydroxide, and a hydrogen peroxide solution, or a non-ionic detergent, such as polyethylene glycol.

In the example depicted in FIG. 7, the first insulation layer 14 is processed so that the electrode insulation layers 24a and 24b and the barrier layers 23a and 23b are removed and the end surfaces of the electrically conductive layers 60a and 60b are exposed at the same level as the first insulation layer 14. The first insulation layer 14 may be processed so that part of the end parts of the electrically conductive layers 60a and 60b is polished. Further, the first insulation layer 14 may be processed so that the barrier layers 23a and 23b, or the electrode insulation layers 24a and 24b, or the first insulation layer 14 is left on the end surfaces of the electrically conductive layers 60a and 60b. In this case, the barrier layers 23a and 23b covering the end surfaces of the electrically conductive layers 60a and 60b or the first insulation layer 14 is removed in the next process.

Next, as depicted in FIG. 8, the electrically conductive layers 60a and 60b and the first insulation layer 14 are processed so that the length of the portions of the electrically conductive layers 60a and 60b protruding from the second surface 11b becomes less than the thickness of the first insulation layer 14. When the length of the portions of the electrically conductive layers 60a and 60b protruding from the second surface 11b is less than the thickness of the first insulation layer 14, the first insulation layer 14 is no longer needs to be processed.

As the processing method of the electrically conductive layers 60a and 60b and the first insulation layer 14, it is possible to use the polishing method, such as chemical mechanical polishing (CMP), or the etching method, such as wet etching and dry etching. As the processing method, one having a processing rate for the electrically conductive layers 60a and 60b higher than that for the first insulation layer 14 is preferable from the viewpoint of making the length of the portions of the electrically conductive layers 60a and 60b protruding from the second surface 11b less than the thickness of the first insulation layer 14. The processing rate means the polishing rate or the etching rate.

In the present embodiment, as described above, the electrically conductive layers 60a and 60b are formed by copper, and therefore, as the processing method, CMP the same as that in the process depicted in FIG. 7 is selected. The slurry used in the process depicted in FIG. 7 has a polishing rate equal to or higher than a predetermined rate for copper, and therefore, the same slurry as the slurry in the process depicted in FIG. 7 is used in CMP.

Consequently, in the present embodiment, the processes depicted in FIG. 7 and FIG. 8 are performed using CMP, the same processing method, and the same slurry. That is, it is possible to perform the processes depicted in FIG. 7 and FIG. 8 in one process.

In the manner such as this, in the first insulation layer 14, the openings 17a and 17b through which the surfaces of the electrically conductive layers 60a and 60b are exposed are formed.

The electrically conductive layers 60a and 60b are processed so that the surfaces of the electrically conductive layers 60a and 60b exposed through the openings 17a and 17b of the first insulation layer 14 become concave toward the side of the first surface 11a of the first semiconductor substrate 11. The reason is that CMP is the isotropic polishing method. Specifically, the reason is that the centers of the exposed surfaces of the electrically conductive layers 60a and 60b are supplied with a larger amount of etching component in the slurry than that supplied to the periphery of the surfaces. Because of this, on the exposed surfaces of the electrically conductive layers 60a and 60b, the polishing rate of the centers of the surfaces is higher than that of the periphery of the surfaces. Consequently, the end surfaces 21a and 21b on the side of the second surface 11b in the lengthwise direction of the electrically conductive layers 60a and 60b are polished into the shape concave toward the side of the first surface 11a of the first semiconductor substrate 11.

In the manner such as this, the through electrodes 20a and 20b penetrating through the first semiconductor substrate 11 are formed.

Further, the first insulation layer 14 is processed so that the periphery of the openings 17a and 17b slants toward the electrically conductive layers 60a and 60b, and thus the slant parts 14a and 14b are formed. The reason that the slant parts 14a and 14b are formed is the same as that the end surfaces 21a and 21b having the above-described concave shape are formed.

In this manner, the concave parts 16a and 16b having a curved surface are formed by the end surfaces 21a and 21b and the slant parts 14a and 14b. It is preferable for the shape of the curved surfaces of the concave parts 16a and 16b to agree with the radius of curvature determined based on the surface tension of the bumps 42a and 42b in the molten state when laminating the second semiconductor substrate 31 on the first semiconductor substrate 11 from the viewpoint of forming an excellent electrical connection state of the bumps and the end surfaces.

Figure 9:
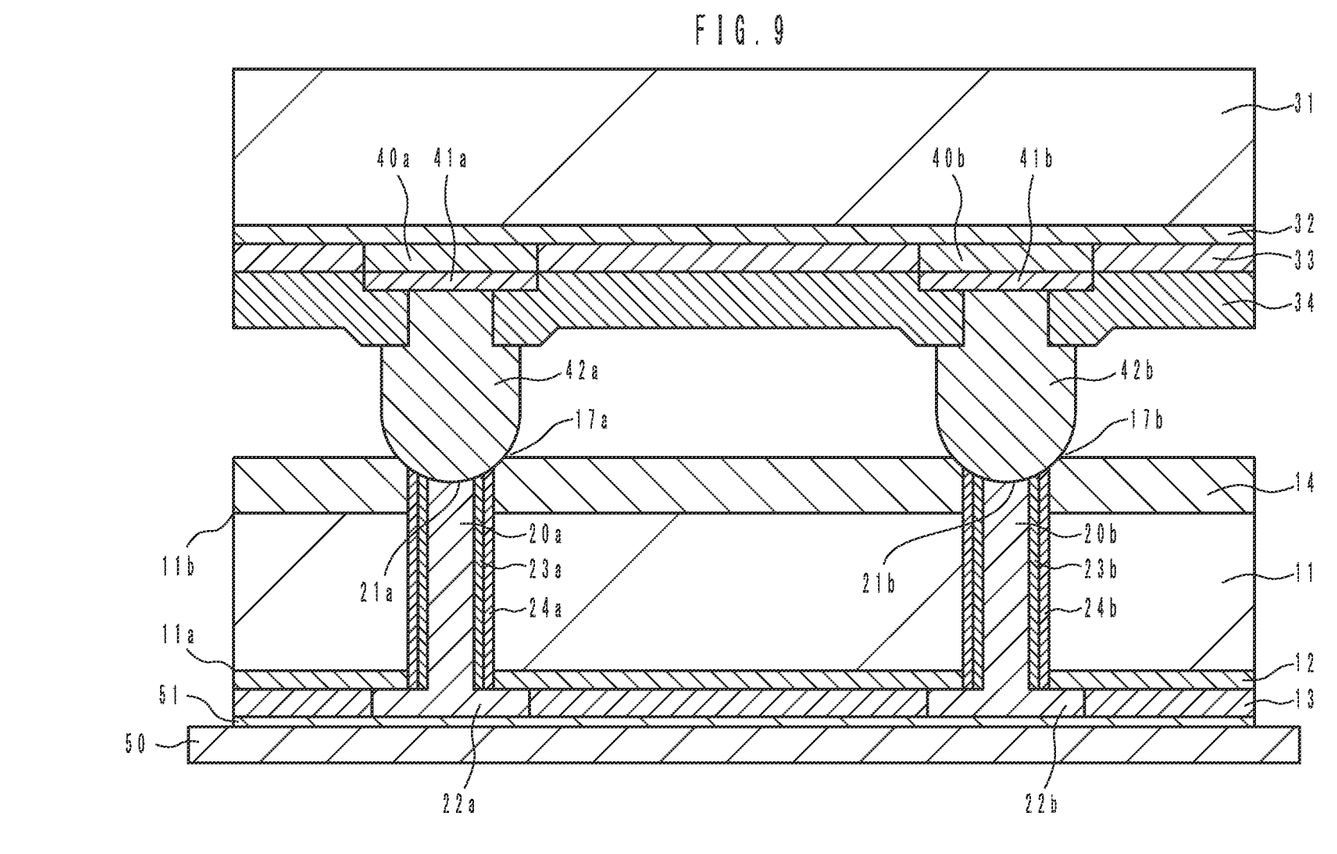
FIG. 9 is a diagram depicting the process (part 7) of the first embodiment of the manufacturing method of the semiconductor device disclosed in the present specification.

Next, as depicted in FIG. 9, the second semiconductor substrate 31 having the bumps 42a and 42b heated and in the molten state is laminated on the first semiconductor substrate 11 so that the bumps 42a and 42b come into contact with the end surfaces 21a and 21b of the through electrodes 20a and 20b exposed in the openings 17a and 17b. The second semiconductor substrate 31 is pressed onto the first semiconductor substrate 11 so that the bumps 42a and 42b in the molten state are inserted into the concave parts 16a and 16b. Then, the cooled bumps 42a and 42b are electrically joined to the end surfaces 21a and 21b of the through electrodes 20a and 20b.

Then, the space between the first insulation layer 14 and the second insulation layer 34 is filled with a filler so as to embed the bumps 42a and 42b, and thus a filler layer, not depicted, is formed. Then, the adhesive layer 51 is detached from the contacts 22a and 22b on which the bumps are formed and the first wire layer 13, and thus the semiconductor device depicted in FIG. 2 is formed.

According to the first embodiment of the manufacturing method of the semiconductor device described above, it is possible to prevent a bad joint between the bump and the through electrode.

Specifically, the end surfaces 21a and 21b of the through electrodes 20a and 20b are within the concave parts 16a and 16b, and therefore, the bumps 42a and 42b in the molten state are suppressed from flowing onto the first insulation layer 14. Further, the contact area between the end surfaces 21a and 21b of the through electrodes 20a and 20b and the bumps 42a and 42b in the molten state is large compared to that in the case where the end surface of the through electrode is flat, and therefore, it is possible to reduce the contact resistance.

Furthermore, according to the first embodiment of the manufacturing method of the semiconductor device of the present embodiment, it is possible to solve the conventional problems illustrated below.

In the conventional example depicted in FIG. 1, there is a case where the first insulation layer 114 is formed by the spin coat method and the portion of the first insulation layer 114 formed on the through electrodes 120a and 120b protruding from the second surface 11b of the first semiconductor substrate 11 is removed by dry etching. In the case where there are a part where the density of the through electrode is high and a part where the density is low, at the part where the density is low, the first insulation layer 114 that is applied is formed so as to have a thickness less than that at the part where the density is high due to a difference in the magnitude of the influence of surface tension. Because of this, there is a case where the part where the first insulation layer 114 is thin is removed at the time of etching, and therefore, the first semiconductor substrate 11 is exposed.

On the other hand, according to the first embodiment of the manufacturing method of the semiconductor device of the present embodiment, it is possible to prevent the problem such as this from occurring.

Further, in the conventional example depicted in FIG. 1, there is a case where the first insulation layer 114 is formed by the spin coat method and the portion of the first insulation layer 114 formed on the through electrodes 120a and 120b protruding from the second surface 11b of the first semiconductor substrate 11 is removed by CMP. There is a case where the through electrode protruding from the second surface 11b of the first semiconductor substrate 11 is caused to fall due to CMP.

On the other hand, according to the first embodiment of the manufacturing method of the semiconductor device of the present embodiment, it is possible to prevent the problem such as this from occurring.

Further, in the conventional example, there is a case where the first insulation layer 114 is formed by the CVD method and the portion of the first insulation layer 114 formed on the through electrodes 120a and 120b protruding from the second surface 11b of the first semiconductor substrate 11 is removed by dry etching. At this time, in order to protect the first insulation layer 114 laminated on the first semiconductor substrate 11, a resist layer is formed before dry etching. Because of this, in the case where the first insulation layer 114 is formed by the CVD method, the process to form the resist layer is further provided.

On the other hand, according to the first embodiment of the manufacturing method of the semiconductor device of the present embodiment, the process such as this is obviated.

Next, other embodiments of the manufacturing method of the semiconductor device described above are illustrated below with reference to the drawings. To the other embodiments not illustrated in particular, the illustration described in detail in the first embodiment described above can be applied appropriately. The same symbols are attached to the same components.

Second to fourth embodiments of the manufacturing method of the semiconductor device illustrated below differ from the first embodiment described above in the processes in FIG. 6 to FIG. 8. The processes other than those in FIG. 6 to FIG. 8 are the same as those in the first embodiment described above, and therefore, for the second to fourth embodiments, the processes in FIG. 6 to FIG. 8 are illustrated.

For the second to fourth embodiments of the manufacturing method of the semiconductor device, an example in which the forming material of the first insulation layer 14 is different from that in the first embodiment described above, or an example in which the processing method of the first insulation layer 14 or the electrically conductive layers 60a and 60b is different is illustrated.

First, the second embodiment of the manufacturing method of the semiconductor device is illustrated below with reference to FIG. 6 to FIG. 8.

First, as depicted in FIG. 6, the first insulation layer 14 whose thickness is greater than the length of the portions of the electrically conductive layers 60a and 60b protruding from the second surface 11b is formed on the second surface 11b. In the present embodiment, as in the first embodiment, the first insulation layer 14 is formed by the Low-k material by using the spin coat method.

Next, as depicted in FIG. 7, the first insulation layer 14 is processed so that the thickness of the first insulation layer 14 is reduced until the electrically conductive layers 60a and 60b are exposed. In the present embodiment, as the processing method of the first insulation layer 14, as in the first embodiment, CMP is selected, which has a processing rate equal to or higher than a predetermined rate for the Low-k material forming the first insulation layer 14. Specifically, as the slurry used in CMP, the same slurry as that in the first embodiment is used. In the process depicted in FIG. 7, the electrode insulation layers 24a and 24b and the barrier layers 23a and 23b are removed by polishing and the end surfaces of the electrically conductive layers 60a and 60b are exposed.

Next, as depicted in FIG. 8, the electrically conductive layers 60a and 60b and the first insulation layer 14 are processed so that the length of the portions of the electrically conductive layers 60a and 60b protruding from the second surface 11b becomes less than the thickness of the first insulation layer 14. In the present embodiment, as the processing method of the electrically conductive layers 60a and 60b and the first insulation layer 14, CMP is selected, which has a processing rate equal to or higher than a predetermined rate for copper forming the electrically conductive layers 60a and 60b. As the slurry used in CMP, it is preferable to use the slurry having a polishing rate equal to or higher than a predetermined rate for the electrically conductive layers 60a and 60b from the viewpoint of reducing the tact time of the process. Preferably, the slurry such as this includes abrasive grains, such as colloidal silica, or an organic acid, such as a citric acid, an oxalic acid, and a malic acid, or an amino acid, such as glycine, an additive, such as ammonia water, a hydrogen peroxide solution, a nitric acid, and benzotriazole (BTA).

In the first embodiment of the manufacturing method of the semiconductor device described above, the slurry used in CMP to polish the electrically conductive layers 60a and 60b has a polishing rate equal to or higher than a predetermined rate for the barrier layers 23a and 23b. In the process depicted in FIG. 8 of the present embodiment, it is sufficient to polish the electrically conductive layers 60a and 60b whose copper end surfaces are exposed, and therefore, there are no restrictions in particular on the polishing rate for the barrier layers 23a and 23b. Consequently, the slurry used in CMP to polish the electrically conductive layers 60a and 60b may have a low polishing rate for the barrier layers 23a and 23b. Because of this, in the present embodiment, as the slurry used in CMP, slurry having a polishing rate equal to or higher than a predetermined rate for copper forming the electrically conductive layers 60a and 60b is used.

In the present embodiment, the slurry used in CMP in the process depicted in FIG. 7 is different from the slurry used in CMP in the process depicted in FIG. 8.

Next, a third embodiment of the manufacturing method of the semiconductor device is illustrated below with reference to FIG. 6 to FIG. 8.

First, as depicted in FIG. 6, the first insulation layer 14 whose thickness is greater than the length of the portions of the electrically conductive layers 60a and 60b protruding from the second surface 11b is formed on the second surface 11b. In the present embodiment, the first insulation layer 14 is formed by resin, such as polyimide resin and epoxy resin, by using the spin coat method.

Next, as depicted in FIG. 7, the first insulation layer 14 is processed so that the thickness of the first insulation layer 14 is reduced until the electrically conductive layers 60a and 60b are exposed. In the present embodiment, as the processing method of the first insulation layer 14, single point tool grinding having a processing rate equal to or higher than a predetermined rate for the resin forming the first insulation layer 14 is selected. The single point tool grinding is a grinding method for grinding the surface of a rotating semiconductor substrate using a reciprocating blade. For the resin forming the first insulation layer 14, the polishing rate of CMP is low, and therefore, the grinding method having a high processing rate for resin is selected. In the process depicted in FIG. 7, the electrode insulation layers 24a and 24b and the barrier layers 23a and 23b are removed by grinding and the end surfaces of the electrically conductive layers 60a and 60b are exposed.

Next, as depicted in FIG. 8, the electrically conductive layers 60a and 60b and the first insulation layer 14 are processed so that the length of the portions of the electrically conductive layers 60a and 60b protruding from the second surface 11b becomes less than the thickness of the first insulation layer 14. In the present embodiment, as the processing method of the electrically conductive layers 60a and 60b and the first insulation layer 14, CMP is selected, which has a processing rate equal to or higher than a predetermined rate for copper forming the electrically conductive layers 60a and 60b. As the slurry used in CMP, it is preferable to use the slurry having a polishing rate equal to or higher than a predetermined rate for the electrically conductive layers 60a and 60b from the viewpoint of reducing the tact time of the process. Preferably, the slurry such as this includes abrasive grains, such as colloidal silica, or an organic acid, such as a citric acid, an oxalic acid, and a malic acid, or an amino acid, such as glycine, an additive, such as ammonia water, a hydrogen peroxide solution, a nitric acid, and benzotriazole (BTA).

In the first embodiment of the manufacturing method of the semiconductor device described above, the slurry used in CMP to polish the electrically conductive layers 60a and 60b has a polishing rate equal to or higher than a predetermined rate for the barrier layers 23a and 23b. In the process depicted in FIG. 8 of the present embodiment, it is sufficient to polish the electrically conductive layers 60a and 60b whose copper end surfaces are exposed, and therefore, there are no restrictions in particular on the polishing rate for the barrier layers 23a and 23b. Consequently, the slurry used in CMP to polish the electrically conductive layers 60a and 60b may have a low polishing rate for the barrier layers 23a and 23b. Because of this, in the present embodiment, as the slurry used in CMP, slurry having a polishing rate equal to or higher than a predetermined rate for copper forming the electrically conductive layers 60a and 60b is used.

As described above, in the present embodiment, as the processing method in the process depicted in FIG. 7, the grinding method is used and as the processing method in the process depicted in FIG. 8, the polishing method is used, and therefore, the processing methods in both the processes are different.

Next, the fourth embodiment of the manufacturing method of the semiconductor device is illustrated below with reference to FIG. 6 to FIG. 8.

First, as depicted in FIG. 6, the first insulation layer 14 whose thickness is greater than the length of the portions of the electrically conductive layers 60a and 60b protruding from the second surface 11b is formed on the second surface 11b. In the present embodiment, the first insulation layer 14 is formed by resin, such as polyimide resin and epoxy resin, by using the spin coat method.

Next, as depicted in FIG. 7, the first insulation layer 14 is processed so that the thickness of the first insulation layer 14 is reduced until the electrically conductive layers 60a and 60b are exposed. In the present embodiment, as the processing method of the first insulation layer 14, single point tool grinding having a processing rate equal to or higher than a predetermined rate for the resin forming the first insulation layer 14 is selected. In the process depicted in FIG. 7, the electrode insulation layers 24a and 24b and the barrier layers 23a and 23b are removed by grinding and the end surfaces of the electrically conductive layers 60a and 60b are exposed.

Next, as depicted in FIG. 8, the electrically conductive layers 60a and 60b and the first insulation layer 14 are processed so that the length of the portions of the electrically conductive layers 60a and 60b protruding from the second surface 11b becomes less than the thickness of the first insulation layer 14. In the present embodiment, as the processing method of the electrically conductive layers 60a and 60b and the first insulation layer 14, wet etching is selected, which has a processing rate equal to or higher than a predetermined rate for copper forming the electrically conductive layers 60a and 60b. In wet etching, it is preferable to use an etching solution having an etching rate equal to or higher than a predetermined rate for the electrically conductive layers 60a and 60b from the viewpoint of reducing the tact time of the process. As the etching solution such as this, it is possible to use, for example, a hydrogen peroxide solution, a hydrofluoric acid, a nitric acid, a sulfuric acid, or a mixed solution thereof.

In the present invention, it is possible to appropriately change the semiconductor device and the manufacturing method of the semiconductor device of the embodiments described above as long as the gist of the present invention is not deviated. Further, it is also possible to appropriately apply components in an embodiment to the other embodiments.

In the process in FIG. 8 of the embodiment of the manufacturing method of the semiconductor device described above, the concave parts 16a and 16b have the curved shape concave toward the side of the first surface 11a of the first semiconductor substrate 11. The concave parts 16a and 16b may have another shape as long as the length of the portions of the electrically conductive layers 60a and 60b protruding from the second surface 11b becomes less than the thickness of the first insulation layer 14.

Figure 10:
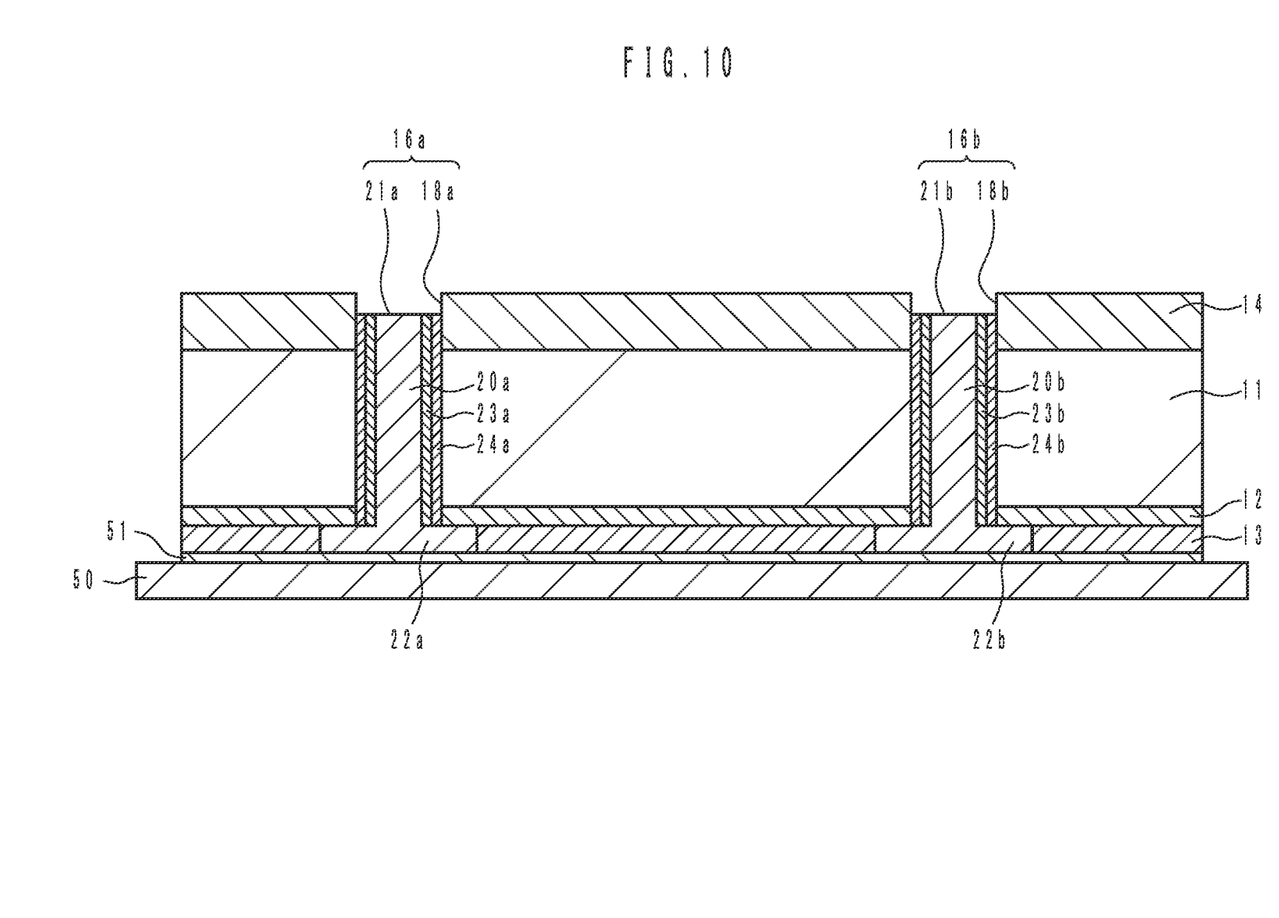
FIG. 10 is a diagram depicting another embodiment of the manufacturing method of the semiconductor device disclosed in the present specification.

For example, as depicted in FIG. 10, the concave parts 16a and 16b may be formed by the end surfaces 21a and 21b having flat surfaces and vertical parts 18a and 18b having an orientation vertical to the end surfaces 21a and 21b. It is possible to form the end surfaces 21a and 21b having flat surfaces by, for example, dry etching.

Figure 11:
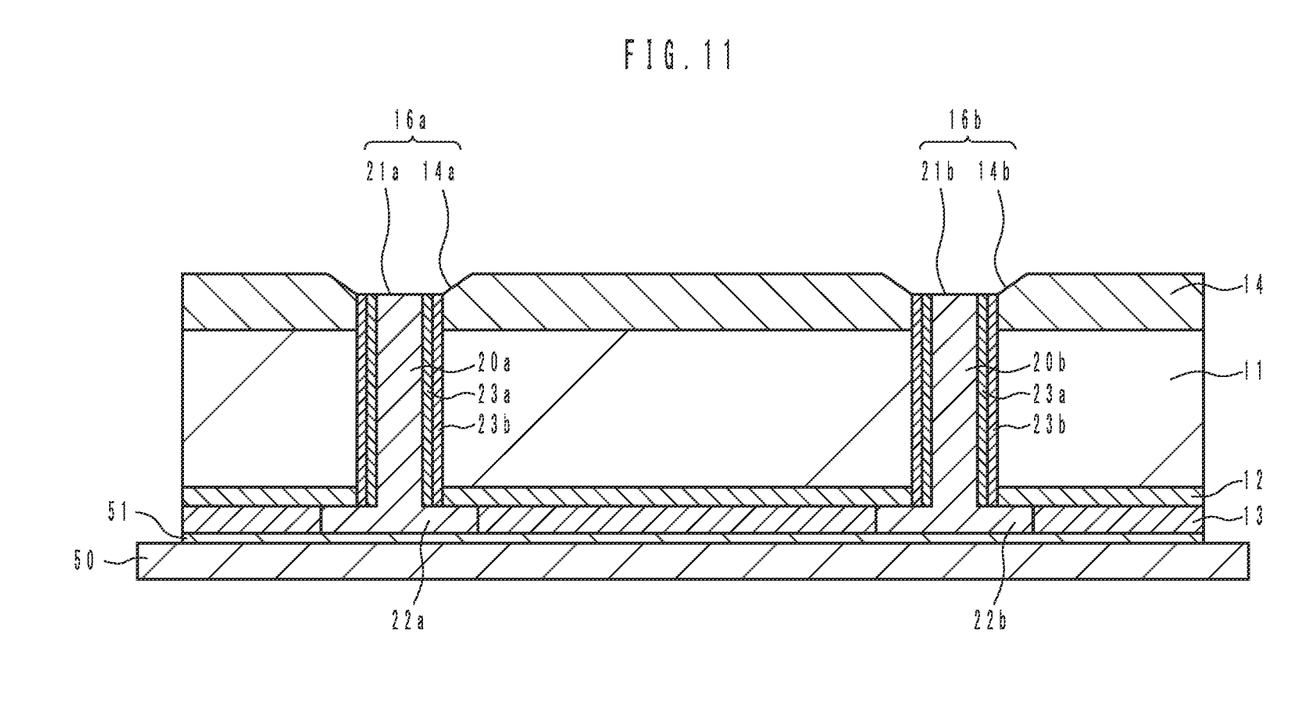
FIG. 11 is a diagram depicting still another embodiment of the manufacturing method of the semiconductor device disclosed in the present specification.

Further, as depicted in FIG. 11, the concave parts 16a and 16b may be formed by the end surfaces 21a and 21b having flat surfaces and the slant parts 14a and 14b having an orientation inclined with respect to the end surfaces 21a and 21b.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it is to be understood that the various changes, substitutions, and alterations are possible without departing from the sprit and scope of the invention.

What is claimed is:

1. A manufacturing method of a semiconductor device comprising:
   forming an electrically conductive layer extending from a first surface of a semiconductor substrate toward the side of a third surface up to part of the way;
   forming a protrusion by forming a second surface by processing the semiconductor substrate from the side of the third surface to reduce the thickness of the semiconductor substrate and by protruding part of the electrically conductive layer from the second surface;
   covering the protrusion by forming an insulation layer having a thickness greater than the length of the protrusion on the second surface; and
   forming an opening in the insulation layer, through which to expose an end surface of the protrusion from the second surface, by reducing the thickness of the entire insulation layer and also processing the insulation layer and the protrusion so that the length of the protrusion becomes less than the thickness of the insulation layer, wherein
   the processing the insulation layer and the protrusion comprises:
      processing first the insulation layer so that the thickness of the entire insulation layer is reduced until the protrusion is exposed; and
      processing second the protrusion so that the length of the protrusion becomes less than the thickness of the insulation layer.

2. The manufacturing method of a semiconductor device according to claim 1, wherein
   the processing the insulation layer and the protrusion processes the protrusion so that the end surface becomes concave toward the side of the first surface of the semiconductor substrate.

3. The manufacturing method of a semiconductor device according to claim 1, wherein
   the processing the insulation layer and the protrusion processes the protrusion so that the end surface becomes flat.

4. The manufacturing method of a semiconductor device according to claim 1, wherein
   the processing the insulation layer and the protrusion processes the insulation layer so that the periphery of the opening inclines toward the protrusion.

5. The manufacturing method of a semiconductor device according to claim 1, wherein
   the processing first has grinding.

6. The manufacturing method of a semiconductor device according to claim 5, wherein
   the polishing of the processing first uses slurry having any of abrasive grains including colloidal silica, an organic acid including a chelating agent, a citric acid, or an oxalic acid, an additive including ammonia water, potassium hydroxide, or a hydrogen peroxide solution, and a non-ionic detergent including polyethylene glycol.

7. The manufacturing method of a semiconductor device according to claim 1, wherein
   the processing second has a first processing rate for the insulation layer and a second processing rate for the electrically conductive layer, and
   the second processing rate is higher than the first processing rate.

8. The manufacturing method of a semiconductor device according to 1, wherein
   the processing second has polishing or etching.

9. The manufacturing method of a semiconductor device according to claim 8, wherein
   the polishing of the processing second uses slurry comprising any of abrasive grains including colloidal silica, an organic acid including a citric acid, an oxalic acid, or a malic acid, an amino acid including glycine, and an additive including ammonia water, a hydrogen peroxide solution, a nitric acid, or benzotriazole.

10. The manufacturing method of a semiconductor device according to claim 8, wherein
    the etching of the processing second is wet etching using a hydrogen peroxide solution, a hydrofluoric acid, a nitric acid, a sulfuric acid, or a mixed solution thereof.

11. The manufacturing method of a semiconductor device according to claim 1, wherein
    before the processing the electrically conductive layer, an element layer is formed on the first surface of the semiconductor substrate.

* * * * *